(12) United States Patent
Nishihata

(10) Patent No.: US 8,642,682 B2
(45) Date of Patent: Feb. 4, 2014

(54) RESIN COMPOSITION FOR ENCAPSULATION AND SEMICONDUCTOR UNIT ENCAPSULATED WITH RESIN

(75) Inventor: Naomitsu Nishihata, Tokyo (JP)

(73) Assignee: Kureha Corporation, Tokyo (JP)

( * ) Notice: Subject to any disclaimer, the term of this patent is extended or adjusted under 35 U.S.C. 154(b) by 590 days.

(21) Appl. No.: 11/587,479

(22) PCT Filed: Apr. 25, 2005

(86) PCT No.: PCT/JP2005/008324
§ 371 (c)(1),
(2), (4) Date: Oct. 25, 2006

(87) PCT Pub. No.: WO2005/105919
PCT Pub. Date: Nov. 10, 2005

(65) Prior Publication Data
US 2008/0242768 A1    Oct. 2, 2008

(30) Foreign Application Priority Data
Apr. 30, 2004    (JP) ................................. 2004-135324

(51) Int. Cl.
*C08L 63/00*     (2006.01)
(52) U.S. Cl.
USPC ........................................................ 523/468
(58) Field of Classification Search
USPC ........................................................ 523/468
See application file for complete search history.

(56) References Cited

U.S. PATENT DOCUMENTS

| | | | |
|---|---|---|---|
| 5,064,881 A | 11/1991 | Togashi et al. | |
| 5,567,749 A * | 10/1996 | Sawamura et al. | ........... 523/443 |
| 6,372,351 B1 | 4/2002 | Takemiya et al. | |
| 6,545,081 B1 | 4/2003 | Nishihata et al. | |

FOREIGN PATENT DOCUMENTS

| | | |
|---|---|---|
| JP | 2000-063636 | 8/1998 |
| JP | 11-323097 | 3/1999 |
| JP | 2001-226562 | 2/2000 |
| JP | 2002-121402 | 10/2000 |
| JP | 2002-212398 | 1/2001 |
| JP | 2002-249546 | 2/2001 |
| JP | 2002-348439 | 5/2001 |
| JP | 2001-354838 A | 12/2001 |
| JP | 2002-317032 A | 10/2002 |
| JP | 2004-327557 | 4/2003 |
| JP | 2003-327792 A | 11/2003 |
| JP | 2003-335922 A | 11/2003 |
| JP | 2004-156050 A | 6/2004 |

OTHER PUBLICATIONS

International Search Report.
Office Action from corresponding Korean application, Jul. 13, 2011.

* cited by examiner

*Primary Examiner* — Mark Eashoo
*Assistant Examiner* — Megan McCulley
(74) *Attorney, Agent, or Firm* — Porter Wright Morris & Arthur LLP

(57) ABSTRACT

A resin composition for encapsulation, which contains 100 parts by weight of a synthetic resin, 10 to 500 parts by weight of a carbon precursor having a volume resistivity of $10^2$ to $10^{10}$ Ω·cm, 0 to 60 parts by weight of a conductive filler having a volume resistivity lower than $10^2$ Ω·cm and 100 to 1,500 parts by weight of an other inorganic filler.

6 Claims, No Drawings

RESIN COMPOSITION FOR ENCAPSULATION AND SEMICONDUCTOR UNIT ENCAPSULATED WITH RESIN

TECHNICAL FIELD

The present invention relates to a resin composition for encapsulation, which is suitable for use in resin encapsulation for semiconductor devices and their peripheral electrode wirings and the like. More particularly, the present invention relates to a resin composition for encapsulation, which is excellent in electrical insulating property, mechanical properties, heat resistance, chemical resistance, dimensional stability and the like, and moreover by which the surface resistivity of an encapsulated molded product (a solidified or cured product of the resin composition) can be strictly and stably controlled within a semiconductive region. The present invention also relates to semiconductor units such as semiconductor devices, in which semiconductor elements are resin-encapsulated with the resin composition for encapsulation.

BACKGROUND ART

In order to protect semiconductor elements mounted on a lead-frame, substrate, package or the like, and their peripheral electrode wirings and the like from an external environment, resin encapsulation that a resin is poured around them to encapsulate them is conducted. The resin encapsulation is conducted for the purpose of protecting semiconductor elements such as IC and LSI, and wirings such as bonding wires, inner leads from an external environment and improving handling property upon mounting.

As a resin for encapsulation, is mainly used an epoxy type encapsulant. In the epoxy type encapsulant, is generally an epoxy compound (epoxy resin) having at least 2 epoxy groups in its molecule. When a curing agent is added to this compound, and the resultant mixture is heated, a cured product excellent in chemical resistance and mechanical strength is obtained. As the epoxy type encapsulant, is used an epoxy type resin composition, in which an epoxy resin is used as a principal agent, and secondary agents selected from a curing agent, a curing accelerator, a plasticizer, a filler, a coupling agent, a flame retardant auxiliary, a colorant, a parting agent, an ion scavenger and the like are suitably added thereto.

Methods for the resin encapsulation include a transfer molding method, a dipping method, a potting method, a powder fluidization dipping method, etc. Among these, most of packages are resin-encapsulated by the transfer molding method because it is suitable for mass production. In order to conduct resin encapsulation with the epoxy type encapsulant by the transfer molding method, a process comprising forming the epoxy type encapsulant into tablets (B-stage solid bodies), inserting the epoxy tablets into a mold heated to a high temperature and pressurizing the mold to encapsulate a semiconductor chip or module installed in the mold in advance is generally adopted. The epoxy resin material forms a resin-encapsulated part cured by heating. A process for conducting resin encapsulation by injection molding using the epoxy type encapsulant has been recently proposed.

A resin material for encapsulation is required to have excellent electrical insulating property, mechanical properties, heat resistance, chemical resistance and dimensional stability and also to have properties such as moisture resistance, stress-relieving ability, circuit-shielding ability, light-screening ability and heat-radiating ability. For example, a semiconductor element such as IC is a minute circuit in itself, so that resin encapsulation must be conducted in a state that insulating property between terminals has been retained. Therefore, the resin material for encapsulation requires having electrical insulating property. Since the circuit of the semiconductor element is liable to be broken by water and ionic impurities, the resin material for encapsulation is also required to be low in coefficient of moisture absorption (coefficient of water absorption).

In order to obtain a resin material for encapsulation satisfying such various required properties, there have heretofore been proposed, for example, methods of selecting the kinds of a resin and a filler or raising the content of the filler. More specifically, there have been proposed an epoxy resin composition, in which spherical silica having a specific particle size distribution is incorporated for the purpose of making the mold shrinkage factor of a cured product low to permit precise injection molding (Japanese Patent Application Laid-Open No. 11-323097; U.S. Pat. No. 5,064,881), a liquid semiconductor encapsulant with amorphous silica powder having excellent dispersibility filled into a liquid epoxy resin (Japanese Patent Application Laid-Open No. 2002-212398), an epoxy resin composition for encapsulation of semiconductors, in which partially spherical silica having a vitrification rate of 10 to 95% by weight is incorporated into an epoxy resin for the purpose of making a coefficient of linear expansion high to obtain a cured product low in water absorption property and rate of crack initiation (Japanese Patent Application Laid-Open No. 2000-063636), a composition with 40 to 85% by mass of spherical silica having an average particle diameter of 2 to 10 μm and an extremely small specific surface area contained in a liquid cyclic skeletal-containing epoxy resin for the purpose of obtaining a cured product excellent in resistance to thermal adhesion, moisture resistance and flexural modulus (Japanese Patent Application Laid-Open No. 2001-226562), a resin composition for encapsulation, in which fused silica and crystalline silica are incorporated into a dicyclopentadiene type epoxy resin in combination for the purpose of retaining or improving crack resistance upon solder reflowing even when an after cure step is omitted (Japanese Patent Application Laid-Open No. 2002-249546), and the like.

However, the conventional resin materials for encapsulation have involved a problem that they cannot sufficiently cope with ESD troubles such as an electrostatic discharge phenomenon by static electricity and electrostatic destroy caused by this electrostatic discharge phenomenon. With the advancement of high-density and fine-pitch modules in electronic devices such as semiconductor elements, such an electronic device tends to be charged by the influence of frictional electrification at a resin-encapsulated part when the resin-encapsulated part has a surface resistivity exceeding $10^{13}\Omega/\square$. The electronic device charged and stored with static electricity is damaged by discharge of the static electricity and electrostatically adsorbs suspended dust in the air. On the other hand, an electronic device, which has a resin-encapsulated part having a surface resistivity lower than $10^{5}\Omega/\square$ may suffer from trouble in some cases by a strong current or high voltage generated upon discharge of static electricity because a charge transfer speed in the resin-encapsulated part is too fast. In addition, when the surface resistivity of the resin-encapsulated part is too low, it is impossible to retain electrical insulating property.

In the electronic device resin-encapsulated with the resin material for encapsulation, the problem of the ESD troubles by the resin-encapsulated part has heretofore not been sufficiently recognized by those skilled in the art. There has been no proposal for solving the problem of the ESD troubles in the resin material for encapsulation. With the advancement of high-density and fine-pitch modules in electronic devices, the resin materials used in the technical field of these devices also have an important object of enabling them to cope with the ESD troubles from the viewpoints of sufficiently protecting the electronic devices from the electrostatic trouble and repelling dust to retain high cleanness.

The methods of selecting the kinds of an epoxy resin and a filler and the particle diameter and particle size distribution of the filler like the conventional epoxy type encapsulants cannot cope with the ESD troubles under the circumstances. In order to cope with the ESD troubles, it is necessary to control the surface resistivity of the resin-encapsulated part within a range of $10^5$ to $10^{13}\Omega/\square$ that is a semiconductive region. However, it has been extremely difficult to develop a resin material for encapsulation, by which the surface resistivity of a resin-encapsulated part can be strictly and stably controlled within the range of $10^5$ to $10^{13}\Omega/\square$ that is a semiconductive region while retaining properties such as electrical insulating property, mechanical properties, heat resistance, chemical resistance, dimensional stability and moisture resistance that are required of the resin-encapsulated part.

As a method for lowering the surface resistivity of the resin-encapsulated part, is considered a method of incorporating an antistatic agent or conductive filler into a resin material for encapsulation. In the method of incorporating the antistatic agent into the resin material for encapsulation, however, the antistatic agent present on the surface of the resin-encapsulated part is easily removed by washing or friction to lose the antistatic effect. When the amount of the antistatic agent incorporated is increased to make the antistatic agent easy to bleed from the interior of the resin-encapsulated part to the surface thereof, the antistatic effect can be somewhat sustained, but dust adheres to the surface of the resin-encapsulated part due to the antistatic agent bled, and the electronic device and an environment are contaminated by dissolving-out or volatilization of the antistatic agent. When the antistatic agent is incorporated in a great amount, the heat resistance of the resin-encapsulated part is lowered.

On the other hand, according to the method of incorporating the conductive filler having a volume resistivity lower than $10^2$ $\Omega\cdot$cm, such as conductive carbon black or carbon fiber, into the resin material for encapsulation, the surface resistivity of the resin-encapsulated part is greatly changed even by a slight change in the proportion of the conductive filler incorporated and a slight change in molding conditions, since a difference in electric resistivity between the resin component and the conductive filler is great. Therefore, the method of simply incorporating the conductive filler is extremely difficult to strictly and stably control the surface resistivity of the resin-encapsulated part to a desired value within the range of $10^5$ to $10^{13}\Omega/\square$. In addition, according to the method of incorporating the conductive filler, the surface resistivity of the resin-encapsulated part is liable to great variation in different localities. The resin-encapsulated part showing great variation in surface resistivity has a possibility that electrical insulating property between terminals of a semiconductor element may be impaired, since places too high in surface resistivity and places too low in surface resistivity are present in a state mixed in the resin-encapsulated part. In addition, such a resin-encapsulated part cannot sufficiently protect the electronic device from the ESD troubles.

DISCLOSURE OF THE INVENTION

It is an object of the present invention to provide a resin composition for encapsulation, which is excellent in properties such as mechanical properties, heat resistance, chemical resistance and dimensional stability, and moreover by which the surface resistivity of an encapsulated molded product can be strictly controlled within a semiconductive region while retaining electrical insulating property. Another object of the present invention is to provide a semiconductor unit, in which a semiconductor element is resin-encapsulated with such a resin composition for encapsulation having excellent properties.

The present inventors have conceived a resin composition obtained by incorporating a great amount of an inorganic filler into a synthetic resin and blending a carbon precursor having a volume resistivity of $10^2$ to $10^{10}$ $\Omega\cdot$cm singly, or the carbon precursor and a conductive filler having a volume resistivity lower than $10^2$ $\Omega\cdot$cm in combination. As the synthetic resin, is preferred a thermosetting resin. As the thermosetting resin, is preferred an epoxy resin commonly used as a resin material for encapsulation.

According to the resin composition for encapsulation of the present invention, the surface resistivity of a molded product (solidified product or cured product) thereof can be strictly and stably controlled to a desired value within a semiconductive region while retaining electrical insulating property, and variation in the surface resistivity with the locality is also little. The resin composition for encapsulation of the present invention is also excellent in properties such as mechanical properties, heat resistance, chemical resistance and dimensional stability. Accordingly, the resin composition for encapsulation of the present invention can exhibit high performance suitable for a resin material for encapsulation. The present invention has been led to completion on the basis of these findings.

According to the present invention, there is thus provided a resin composition for encapsulation, comprising 100 parts by weight of a synthetic resin (A), 10 to 500 parts by weight of a carbon precursor (B) having a volume resistivity of $10^2$ to $10^{10}$ $\Omega\cdot$cm, 0 to 60 parts by weight of a conductive filler (C) having a volume resistivity lower than $10^2$ $\Omega\cdot$cm and 100 to 1,500 parts by weight of an other inorganic filler (D).

According to the present invention, there is also provided a resin composition for encapsulation, wherein the synthetic resin is a thermosetting resin. According to the present invention, there is further provided an epoxy resin composition for encapsulation, wherein the thermosetting resin is an epoxy resin component containing an epoxy compound having at least 2 epoxy groups in its molecule and a curing agent.

According to the present invention, there is still further provided a semiconductor unit, in which a semiconductor element is resin-encapsulated with the above-described resin composition for encapsulation.

BEST MODE FOR CARRYING OUT THE INVENTION

1. Synthetic Resin

No particular limitation is imposed on the synthetic resin used in the present invention, and examples thereof include polyamide, polyacetal, polybutylene terephthalate, polyethylene terephthalate, polyethylene, polypropylene, polyisobutylene, polyisoprene, polybutene, poly(p-xylene), polyvinyl chloride, polyvinylidene chloride, polycarbonate, modified poly(phenylene ether), polyurethane, polydimethylsiloxane, polyvinyl acetate, polystyrene, polymethyl acrylate, polymethyl methacrylate, ABS resins, poly(phenylene sulfide), poly(ether ether ketone), poly(ether ketone), poly(phenylene sulfide ketone), poly(phenylene sulfide sulfone), poly(ether nitrile), all-aromatic polyester, fluorocarbon resins, polyallylate, polysulfone, poly(ether sulfone), polyether imide, polyamide-imide, polyaminobismaleimide, diallyl terephthalate resins, triazine resins, epoxy resins, phenol resins, melamine resins, urea resins, and modified product thereof.

Examples of the fluorocarbon resins include tetrafluoroethylene/hexafluoropropylene copolymers, tetrafluoroethylene/perfluoroalkyl vinyl ether copolymers, polychlorotrifluoroethylene, polyvinylidene fluoride, vinylidene fluoride/hexafluoropropylene/tetrafluoroethylene terpolymers, polyvinyl fluoride, ethylene/tetrafluoroethylene copolymers, ethylene/chlorotrifluoroethylene copolymers, propylene/tetrafluoroethylene copolymers, tetrafluoroethylene/perfluoroalkyl perfluorovinyl ether copolymers, vinylidene fluoride/hexafluoropropylene copolymers, vinylidene fluoride/chlorotrifluoroethylene copolymers, tetrafluoro-ethylene/ethylene/isobutylene terpolymers, ethylene/hexafluoropropylene copolymers and tetrafluoroethylene/ethyl vinyl ether copolymers.

These synthetic resins may be used either singly or in any combination thereof.

2. Thermosetting Resin

Among the above-mentioned synthetic resins, thermosetting resins are preferred. Examples of the thermosetting resins used in the present invention include epoxy resins, phenol resins, melamine resins and urea resins, and any publicly known thermosetting resin may be used. The epoxy resins are excellent in dimensional stability. The phenol resins and melamine resins are excellent in impact resistance, heat resistance, chemical resistance, water resistance and flame resistance. The urea resins have a high surface hardness and are characterized by an ivory-like appearance.

Examples of the phenol resins include novolak type phenol resins and resol type phenol resins in addition to commonly used phenol resins obtained by a reaction of phenol with formalin. Examples of a phenol that is a raw material of the phenol resins include phenol, bisphenol A, cresol, alkylphenols, resorcin and naphthol compounds (for example, hydroxynaphthalene and dihydroxynaphthalene). The phenols may be used either singly or in any combination thereof. Examples of a formaldehyde-supplying substance that is a raw material of the phenol resins include an aqueous solution of formaldehyde, paraformaldehyde, an aqueous solution of hexamethylenetetramine and 1,3-dioxolane.

Examples of the melamine resins include commonly used melamine resins obtained by a reaction of melamine with formalin and alkyl-etherified melamine resins (for example, butoxymethylmelamine resins and methoxymethylmelamine resins). Examples of the urea resins include commonly used urea resins obtained by a reaction of urea with formaldehyde. Melamine/urea resins obtained by co-condensation of melamine, urea and formalin and phenol/urea resins obtained by co-condensation of phenol, urea and formalin may also be used as the thermosetting resins.

3. Epoxy Resin

Among the thermosetting resins, epoxy resins commonly used as resins for encapsulation are preferred. An epoxy resin is generally a mixture containing an epoxy compound and a curing agent. The epoxy compound may be often called an epoxy resin by itself. Therefore, in the present invention, the mixture containing the epoxy compound and the curing agent is referred to as "an epoxy resin component".

The epoxy compound used in the present invention is a compound having at least 2 epoxy groups in its molecule. The epoxy compound may be used in any form of solid and liquid. Examples of such an epoxy compound include bisphenol type epoxy resins such as bisphenol A type epoxy resins and bisphenol F type epoxy resins; novolak type epoxy resins such as phenol novolak type epoxy resins, cresol novolak type epoxy resins, alkylphenol novolak type epoxy resins, xylene resin-modified novolak type epoxy resins and α-naphthol novolak type epoxy resins; triphenol alkane type epoxy resins such as triphenol methane type epoxy resins and triphenol propane type epoxy resins; biphenyl skeletal type epoxy resins such as biphenyl type epoxy resins and biphenyl aralkyl type epoxy resins; phenol aralkyl type epoxy resins; heterocyclic type epoxy resins; naphthalene skeletal type epoxy resins; stilbene type epoxy resins; dicyclopentadiene type epoxy resins; and brominated epoxy resins such as tetrabromobisphenol type epoxy resins and brominated phenol novolak type epoxy resins. These epoxy resins may be used either singly or in any combination thereof.

Among these epoxy compounds, such biphenyl skeletal type epoxy resins (chemical formulae 1 and 2), dicyclopentadiene type epoxy resin (chemical formula 3), cresol novolak type epoxy resin (chemical formula 4), naphthalene skeletal type epoxy resins (chemical formulae 5 to 10), triphenol propane type epoxy resins (chemical formulae 11 and 12) and brominated epoxy resins (chemical formulae 13 to 15) as represented by the following chemical formulae 1 to 15 are preferred from the viewpoints of moisture resistance, heat resistance, mechanical properties, moldability, adhesion property, reflow resistance and the like.

In the following chemical formulae 1 to 15, G means a glycidyl group. R in the chemical formula 1 means H or $CH_3$ (preferably, $CH_3$). n stands for 0 or an integer of 1 or greater (generally, 1 to 10). However, n may stand for anther real number than the integer, such as 0.5 or 1.3 when n indicates an average value of a mixture of epoxy resins having various numbers of repeated units, such as n=0, 1 or 2. In the chemical formulae 13 to 15, the number of the bromine atoms (Br) bonded to each aromatic ring is generally 1 to 3, often 1 or 2.

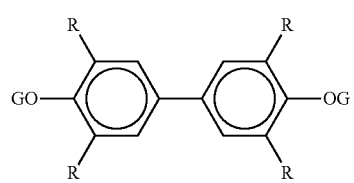

(1)

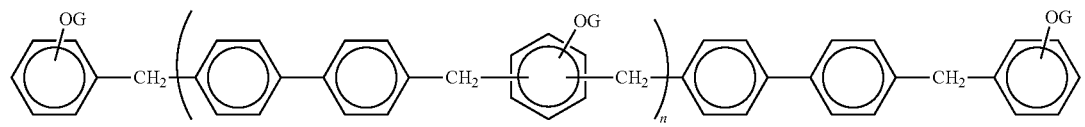

(2)

-continued
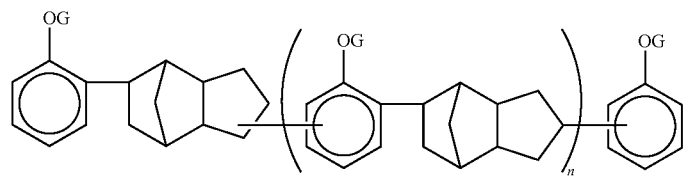
(3)
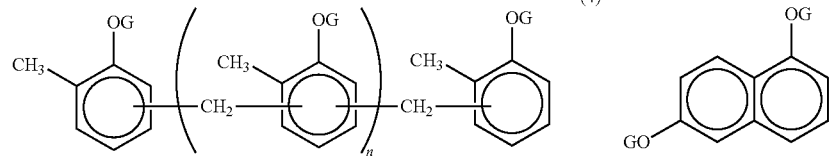
(4)
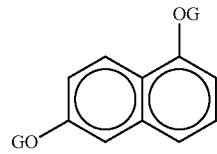
(5)
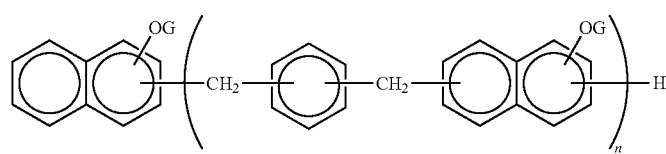
(6)
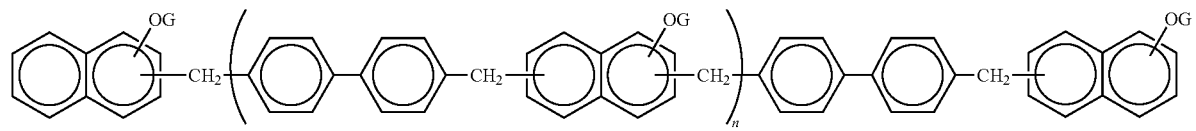
(7)
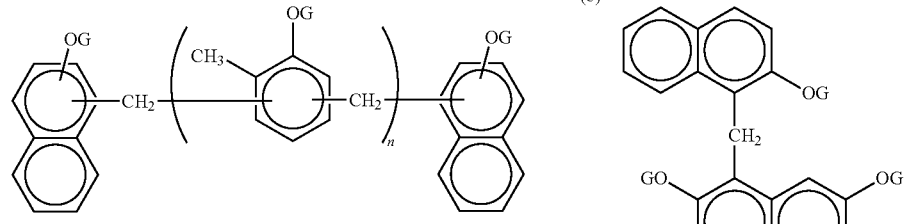
(8)
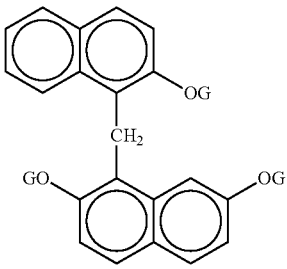
(9)
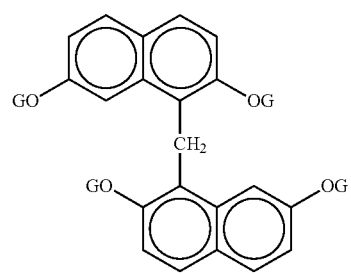
(10)
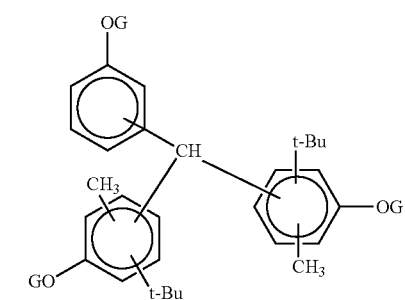
(11)
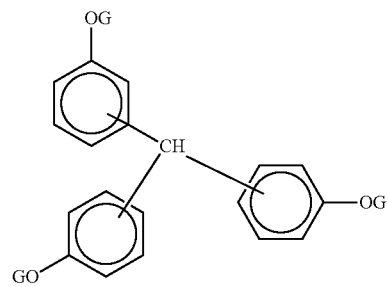
(12)
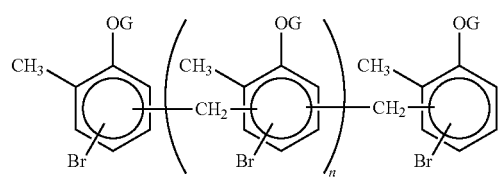
(13)

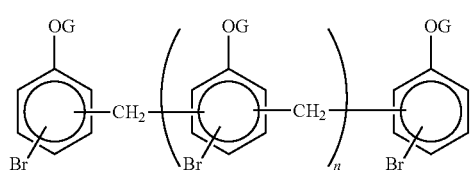

(14)

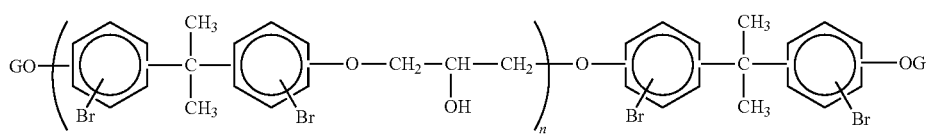

(15)

When the resin-encapsulated part requires being flame-retarded, it is preferable to use a self-extinguishing epoxy resin such as a brominated epoxy resin. When the brominated epoxy resin is used, it is preferable to use a flame retardant auxiliary such as antimony trioxide in combination.

However, it is pointed out that a bromine compound generally involves a problem as an environmental burden compound. It is thus desirable to use another epoxy resin containing no halogen atom in combination when the brominated epoxy resin is used as an epoxy compound. When the brominated epoxy resin is used, it is desirably used in a proportion of generally 1 to 50% by weight, preferably 3 to 30% by weight, more preferably 5 to 20% by weight based on the total weight of the epoxy compounds.

No particular limitation is imposed on the curing agent used in the present invention so far as it is that used as a curing agent for epoxy resins. Examples of the curing agent for the epoxy resins (epoxy compounds) include phenolic compounds having at least 2 phenolic hydroxyl groups, amine compounds, organic acid anhydrides, imidazole compounds, nitrogen-containing heterocyclic compounds such as diazabicycloundecene, organic phosphines, organic boron complexes, quaternary ammonium compounds, and quaternary phosphonium compounds.

These curing agents may be used singly. However, two or more curing agents may also be used in combination for the purpose of controlling a curing speed and physical properties of the resulting cured product. Among these curing agent, the phenolic compounds, amine compounds and organic acid anhydrides are preferred, and the phenolic compounds are more preferred in that the water resistance of the resulting cured product is improved, and they have no reactivity with water.

The phenolic compound used as the curing agent is a compound having at least 2 phenolic hydroxyl groups in its molecule, and examples thereof include novolak type phenol resins such as phenol novolak resins and cresol novolak resins; naphthalene ring-containing phenol resins; phenol aralkyl type phenol resins; biphenyl type phenol resins; biphenyl aralkyl type phenol resins; triphenol alkane type phenol resins such as triphenol methane type phenol resins and triphenol propane type phenol resins; alicyclic phenol resins; heterocyclic type phenol resins; and bisphenol type phenol resins such as bisphenol A type phenol resins and bisphenol F type phenol resins.

These phenolic compounds may be used either singly or in any combination thereof. Among these phenolic compounds, phenol novolak resins, cresol novolak resins, phenol aralkyl type phenol resins, naphthalene type phenol resins, biphenyl type phenol resins and dicyclopentadiene type phenol resins are preferred, and phenol novolak resins are more preferred. Specific examples of preferable phenolic compounds include those represented by the following chemical formulae 16 to 20. In the formulae, n stands for 0 or an integer of 1 or greater (preferably, 1 to 10). In the chemical formula 18, n is an integer of 1 or greater. In the chemical formula 20, R means H or an alkyl group (preferably, $CH_3$).

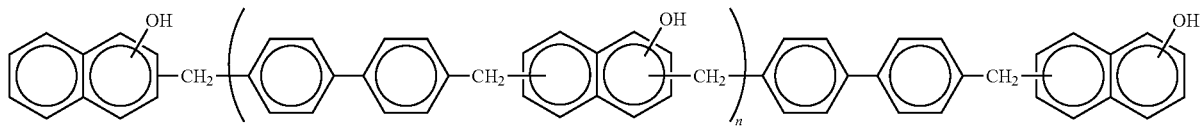

(16)

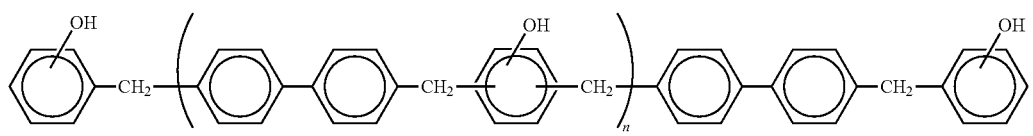

(17)

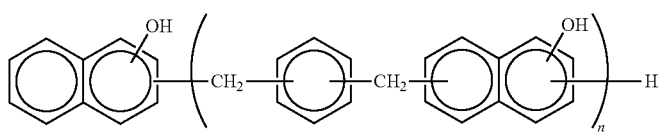

(18)

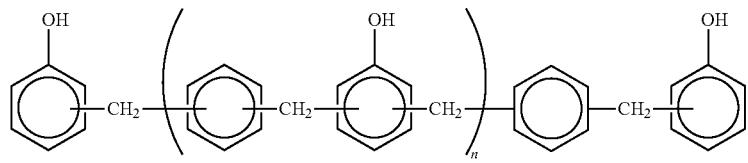

(19)

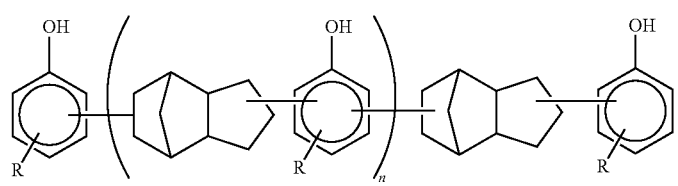

(20)

The curing agent is used in a proportion of generally 0.5 to 1.6 equivalents, preferably 0.6 to 1.4 equivalents, more preferably 0.7 to 1.2 equivalents to the epoxy group of the epoxy compound. In the epoxy resin, the curing agent is incorporated into the skeletal of the resulting cured product. It is thus desirable to select the kind and proportion of the curing agent used according to properties that are required of the resulting cured product.

The phenolic compound preferably used as the curing agent in the present invention is desirably used in a proportion that the phenolic hydroxyl group in the phenolic compound amounts to generally 0.5 to 1.6 mol, preferably 0.6 to 1.4 mol, more preferably 0.7 to 1.2 mol per mol of the epoxy group in the epoxy compound (epoxy resin). If the phenolic compound is used in a proportion that the phenolic hydroxyl group is lower than 0.5 mol, the phenolic hydroxyl group participating in a curing reaction is insufficient, and a proportion of the epoxy group subjected to homopolymerization increases, so that the glass transition temperature of the resulting cured product is liable to be lowered. On the other hand, if the phenolic compound is used in a proportion that the phenolic hydroxyl group exceeds 1.6 mol, the proportion of the phenolic hydroxyl group becomes high to lower curing reactivity. In addition, the crosslink density of the resulting cured product may become low in some cases to fail to achieve sufficient strength.

In order to accelerate the curing reaction between the epoxy compound and the curing agent in the present invention, a curing accelerator may be used as needed. No particular limitation is imposed on the kind of the curing accelerator, and any publicly known curing accelerator having nature that a reaction is initiated by heating, and curing is hardly caused to progress to an extent that obstruction to practical use is caused even when it is mixed with the epoxy resin and other components at ordinary temperature may be used. The curing accelerator may be any of the so-called one-pack latent type that it can be stored in a state mixed as a composition and the so-called two-pack type that curing is immediately started by mixing.

Examples of the curing accelerator include derivatives of 1,8-diazabicyclo[5.4.0]undecane-7, such as the phenol salt, phenol novolak salt and carbonate; imidazoles such as 2-methylimidazole, 2-phenylimidazole, 2-heptadecylimidazole, 2-ethyl-4-methylimidazole and 2-phenyl-4-methylimidazole; organo-phosphine compounds such as ethylphosphine, propylphosphine, phenylphosphine, triphenylphosphine and trialkylphosphines; urea derivatives represented by Ar—NH—CO—N (in the formula, Ar is a substituted or unsubstituted aryl group); and compounds having an imidazole skeletal.

The curing accelerators may be used either singly or in any combination thereof. When the curing accelerator is used, it is incorporated in a proportion of generally 0.2 to 20 parts by weight, preferably 0.5 to 10 parts by weight per 100 parts by weight of the epoxy compound (epoxy resin).

4. Carbon Precursor

The carbon precursor used in the present invention and having a volume resistivity of $10^2$ to $10^{10}$ Ω·cm can be obtained by calcining an organic substance at a temperature of 400° C. to 900° C. in an inert atmosphere. More specifically, the carbon precursor used in the present invention can be produced, for example, in accordance with (i) a process in which tar or pitch such as petroleum tar, petroleum pitch, coal tar or coal pitch is heated to conduct aromatization and polycondensation, and oxidized and non-fusibilized in an oxidizing atmosphere as needed, and the resultant product is further heated and calcined in an inert atmosphere, (ii) a process in which a thermoplastic resin such as polyacrylonitrile or polyvinyl chloride is non-fusibilized in an oxidizing atmosphere and further heated and calcined in an inert atmosphere, or (iii) a process in which a thermosetting resin such as a phenol resin or furan resin is heated and set and then heated and calcined in an inert atmosphere.

In the present invention, the carbon precursor means a substance that is obtained by any of these processes, has a carbon content of at most 97% by mass and is not completely carbonized. When an organic substance is heated and calcined in an inert atmosphere, the carbon content in the resulting calcined product is increased as the calcining temperature is raised. The carbon content in the carbon precursor can be easily controlled by properly presetting the calcining temperature. The carbon precursor used in the present invention and having a volume resistivity of $10^2$ to $10^{10}$ Ω·cm may be provided as a carbon precursor that has a carbon content of 80 to 97% by mass and is in a state incompletely carbonized.

If the carbon content in the carbon precursor is too low, the volume resistivity of such a carbon precursor become too high, and it is hence difficult to control the surface resistivity of an encapsulated molded product (solidified product or cured product) obtained from the resulting resin composition for encapsulation to $10^{13}$Ω/☐ or lower. The volume resistivity of the carbon precursor is preferably $10^2$ to $10^{10}$ Ω·cm, more preferably $10^3$ to $10^9$ Ω·cm.

The carbon precursor is generally used in the form of particles or fiber. The average particle diameter of the carbon precursor particles used in the present invention is preferably 1 mm or smaller. If the average particle diameter of the carbon precursor is too great, it is difficult to provide a solidified product or cured product having good appearance when the resulting synthetic resin composition is molded. When the carbon precursor is in the form of fiber, the average particle diameter thereof is generally 0.1 mm to 1 mm, preferably 0.5 to 500 μm, more preferably 1 to 100 μm. In many cases, the use of the carbon precursor having an average particle diameter of about 5 to 50 μm can yield good results. The average diameter of the fibrous carbon precursor used in the present invention is preferably 0.1 mm or small. If the average diameter of the fibrous carbon precursor exceeds 0.1 mm, it is difficult to provide a cured product having good appearance. The fibrous carbon precursor is preferably short fiber from the viewpoint of dispersibility in a synthetic resin such as an epoxy resin.

In the resin composition for encapsulation according to the present invention, the proportion of the carbon precursor incorporated is 10 to 500 parts by weight, preferably 15 to 450 parts by weight, more preferably 20 to 400 parts by weight per 100 parts by weight of the synthetic resin (for example, the epoxy resin component containing the epoxy compound and the curing agent). When the carbon precursor is used in combination with a conductive filler such as carbon fiber, the surface resistivity can be controlled within the semiconductive region even when the proportion incorporated is reduced to 10 to 50 parts by weight. When the carbon precursor is not used in combination with the conductive filler, the proportion incorporated is preferably controlled within a range of from higher than 50 parts by weight to not higher than 400 parts by weight from the viewpoint of controlling the surface resistivity within a desired range.

If the proportion of the carbon precursor incorporated is too high, the dielectric strength of the resulting solidified product or cured product may possibly become too low. If the proportion of the carbon precursor incorporated is too low, it is difficult to sufficiently lower the surface resistivity of the resulting solidified product or cured product, and it is difficult to control the surface resistivity within the semiconductive region. If the proportion of the carbon precursor incorporated is too low, the surface resistivity of the solidified product or cured product is liable to great variation in different localities.

5. Conductive Filler

No particular limitation is imposed on the conductive filler used in the present invention and having a volume resistivity lower than $10^2$ Ω·cm, and examples thereof include carbon fiber, graphite, conductive carbon black and metallic powder. Among these, conductive carbon materials such as carbon fiber, graphite, conductive carbon black and mixtures thereof are preferred from the viewpoints of easy control and reproducibility of the volume resistivity.

Among the conductive carbon materials, carbon fiber is more preferred because the surface resistivity of the cured product can be strictly controlled within the semiconductive region when the carbon fiber is used in combination with the carbon precursor, and variation in the surface resistivity with the locality can be sufficiently lessened. When the carbon fiber is used, the mechanical properties of the cured product can also be improved.

Examples of the carbon fiber used in the present invention include cellulose-based carbon fiber, polyacrylonitrile-based carbon fiber (PAN-based carbon fiber), lignin-based carbon fiber and pitch-based carbon fiber. Among these carbon fibers, PAN-based carbon fiber and pitch-based carbon fiber are preferred, and PAN-based carbon fiber is more preferred.

The average diameter of the carbon fiber is preferably at most 50 μm. If the average diameter of the carbon fiber is too great, it is difficult to provide a cured product having good appearance. The carbon fiber is preferably short fiber having an average fiber length of at least 10 μm. If carbon fiber too short in the average fiber length is used, the effect to improve mechanical properties is lessened.

No particular limitation is imposed on the conductive carbon black so far as it is conductive. As examples thereof, may be mentioned acetylene black, oil furnace black, thermal black and channel black. Among these, conductive carbon blacks such as oil furnace black and acetylene black are preferred. No particular limitation is imposed on the graphite. As examples thereof, may be mentioned artificial graphite obtained by subjecting coke, tar, pitch or the like to a graphitizing treatment at a high temperature, and natural graphites such as lepidoblastic graphite, flake graphite and earthy graphite.

The volume resistivity of the conductive filler used in the present invention is lower than $10^2$ Ω·cm, and the lower limit thereof is generally a volume resistivity of a metallic material such as metallic powder or metallic fiber.

In the resin composition for encapsulation according to the present invention, the conductive filler may not be always incorporated, and the surface resistivity of the cured product can be controlled within the semiconductive region by single use of the carbon precursor. In order to improve the mechanical strength of the solidified product or cured product or lessen variation in the surface resistivity with the locality, it is preferable to use the carbon precursor and the conductive filler such as carbon fiber in combination.

In the epoxy resin composition for encapsulation according to the present invention, the proportion of the conductive filler incorporated is 0 to 60 parts by weight, preferably 0 to 50 parts by weight, more preferably 0 to 40 parts by weight, particularly preferably 0 to 30 parts by weight per 100 parts by weight of the synthetic resin (for example, the epoxy resin component containing the epoxy compound having at least 2 epoxy groups in its molecule and the curing agent). When the conductive filler such as carbon fiber is used, the proportion of the conductive filler incorporated is generally 1 to 60 parts by weight, preferably 2 to 50 parts by weight, more preferably 3 to 40 parts by weight, particularly preferably 5 to 30 parts by weight per 100 parts by weight of the synthetic resin. If the proportion of the conductive filler incorporated is too high, the surface resistivity of the resulting cured product becomes too low, and the dielectric strength thereof also becomes too low.

6. Other Inorganic Filler

In the present invention, an other inorganic filler is used in addition to the above-described carbon precursor and conductive filler. The other inorganic filler is preferably a non-conductive inorganic filler that does substantially not affect the volume resistivity and surface resistivity of the cured product. In a resin material for encapsulation, fillers generally occupy the highest proportion in quantity and markedly affect the moldability of the resulting resin composition and the properties of a cured product obtained from the composition. Therefore, as the inorganic filler, is preferably used that employed in the technical field of resin materials for encapsulation.

As examples of the inorganic filler, may be mentioned crystalline silica, non-crystalline (amorphous) silica, spherical silica, fused silica, partially spherical silica having a vitrification rate of 10 to 95% by weight, alumina, silicon nitride, talc, clay, glass fiber, glass beads and calcium sulfate. The inorganic fillers may be subjected to a surface treatment or coating treatment. Silica is preferred from the viewpoints of inhibiting the production of burr and improving moisture resistance and low stress characteristic. Spherical alumina and β-type silicon nitride are preferred from the viewpoint of improving the thermal conductivity of the cured product.

Among these inorganic fillers, silica fillers such as crystalline silica, non-crystalline silica, spherical silica, fused silica and partially spherical silica having a vitrification rate of 10 to 95% by weight are preferred in the application field of encapsulants for semiconductor elements. The average particle diameter of silica is about 0.1 to 60 µm, preferably at most 30 µm, more preferably at most 10 µm. These silica fillers may be used either singly or in any combination thereof.

In the epoxy resin composition for encapsulation, the proportion of the other inorganic filler incorporated is 100 to 1,500 parts by weight, preferably 200 to 1,200 parts by weight, more preferably 300 to 1,000 parts by weight, particularly preferably 350 to 900 parts by weight per 100 parts by weight of the synthetic resin (for example, the epoxy resin component containing the epoxy compound having at least 2 epoxy groups in its molecule and the curing agent). If the proportion of the inorganic filler incorporated is too high, the flowability of the resulting resin composition for encapsulation is deteriorated, and the encapsulation moldability thereof is lowered. If the proportion of the inorganic filler incorporated is too low, the water resistance of the resulting resin composition is deteriorated, and other properties are also liable to become unsatisfactory.

7. Coupling Agent

In the present invention, a coupling agent such as a silane coupling agent, titanate coupling agent or aluminum coupling agent may be used for the purpose of improving interfacial adhesion property between the inorganic filler and the synthetic resin.

The silane coupling agent is a silicone compound having at least one functional group such as an amino group, ureido group, epoxy group, isocyanate group or mercapto group in its molecule, such as an alkoxysilane or halosilane.

Specific examples of the silane coupling agent include γ-aminopropyltrimethoxysilane, γ-aminopropyl-triethoxysilane, γ-aminopropylmethoxysilane, γ-phenyl-γ-aminopropyltrimethoxysilane, γ-ureidopropyltriethoxysilane, γ-ureidopropyltrimethoxysilane, γ-ureidopropylmethyltrimethoxysilane, γ-ureidopropyltriethoxysilane, γ-ureidopropylmethyltriethoxysilane, γ-(2-ureidoethyl)aminopropyltrimethoxysilane, γ-glycidoxypropyltrimethoxysilane, γ-glycidoxypropyldimethylmethoxysilane, γ-glycidoxypropyl-triethoxysilane, γ-glycidoxypropylmethyldiethoxysilane, β-(3,4-epoxycyclohexyl)ethyltrimethoxysilane, β-(3,4-epoxycyclohexyl) ethyltriethoxysilane, γ-isocyanatopropyl-trimethoxysilane, γ-isocyanatopropylmethyldimethoxysilane, γ-isocyanatopropyltriethoxysilane, γ-isocyanatopropyl-methyldiethoxysilane, γ-isocyanatopropylethyldimethoxy-silane, γ-isocyanatopropylethyldiethoxysilane, γ-isocyanatopropyltrichlorosilane, γ-mercaptopropyl-trimethoxysilane, γ-mercaptopropyltriethoxysilane, γ-mercaptopropylmethyldimethoxysilane, γ-mercaptopropyl-methyldiethoxysilane, β-mercaptoethyltrimethoxysilane, β-mercaptoethyltriethoxysilane and β-mercaptoethyldimethoxy-silane.

As the titanate coupling agent, may be used, for example, isopropyltriisostearoyl titanate, isopropyltri(N-aminoethylaminoethyl) titanate, diisopropylbis(dioctyl phosphate) titanate, tetraisopropylbis(dioctyl phosphite) titanate, tetraoctylbis(ditridecyl phosphite) titanate, tetra(2,2-diallyloxymethyl-1-butyl)bis(ditridecyl) phosphite titanate, bis(dioctyl pyrophosphate) oxyacetate titanate or bis(dioctyl pyrophosphate)ethylene titanate.

These coupling agents are used in a proportion of generally 0.01 to 5 parts by weight, preferably 0.05 to 3 parts by weight per 100 parts by weight of the other inorganic filler.

8. Thermoplastic Resin

In order to improve the toughness of the thermosetting resin compositions for encapsulation such as the epoxy resin compositions for encapsulation in the present invention, a thermoplastic resin may be contained in the thermosetting resin compositions.

No particular limitation is imposed on the thermoplastic resin, and examples thereof include polyamide, polyacetal, polybutylene terephthalate, polyethylene terephthalate, polyethylene, polypropylene, polyisobutylene, polyisoprene, polybutene, poly(p-xylene), polyvinyl chloride, polyvinylidene chloride, polycarbonate, modified poly(phenylene ether), polyurethane, polydimethylsiloxane, polyvinyl acetate, polystyrene, polymethyl acrylate, polymethyl methacrylate, ABS resins, poly(phenylene sulfide), poly(ether ether ketone), poly(ether ketone), poly(phenylene sulfide ketone), poly(phenylene sulfide sulfone), poly(ether nitrile), all-aromatic polyester, fluorocarbon resins, polyallylate, polysulfone, poly(ether sulfone), polyether imide, polyamide-imide, polyimide, polyaminobismaleimide, diallyl terephthalate resins, styrene-ethylene-butylene-styrene copolymers, MBS resins, and modified product thereof.

Examples of the fluorocarbon resins include tetrafluoroethylene/hexafluoropropylene copolymers, tetrafluoroethylene/perfluoroalkyl vinyl ether copolymers, polychlorotrifluoroethylene, polyvinylidene fluoride, vinylidene fluoride/hexafluoropropylene/tetrafluoroethylene terpolymers, polyvinyl fluoride, ethylene/tetrafluoroethylene copolymers, ethylene/chlorotrifluoroethylene copolymers, propylene/tetrafluoroethylene copolymers, tetrafluoroethylene/perfluoroalkyl perfluorovinyl ether copolymers, vinylidene fluoride/hexafluoropropylene copolymers, vinylidene fluoride/chlorotrifluoroethylene copolymers, tetrafluoro-ethylene/ethylene/isobutylene terpolymers, ethylene/hexafluoropropylene copolymers and tetrafluoroethylene/ethyl vinyl ether copolymers.

These thermoplastic resins may be used either singly or in any combination thereof. The proportion of the thermoplastic resin incorporated is generally at most 50 parts by weight, preferably at most 30 parts by weight, more preferably at most 20 parts by weight per 100 parts by weight of the thermosetting resin (for example, the epoxy resin component containing the epoxy compound having at least 2 epoxy groups in its molecule and the curing agent).

9. Other Additives

Into the resin compositions for encapsulation according to the present invention, may be added other various additives, as needed. Examples of the other additives include parting agents such as natural waxes; impact modifiers such as epoxy group-containing α-olefin copolymers; resin-modifying agents such as ethylene glycidyl methacrylate; mold corrosion inhibitors such as zinc carbonate and nickel carbonate; lubricants such as pentaerythritol tetrastearate, thermosetting resins; antioxidants; ultraviolet absorbents; nucleating agents such as boron nitride; flame retardants such as bromine compounds; flame retardant auxiliaries such as antimony trioxide; colorants such as dyes and pigments; fluorine-containing surfactants; and wetting improvers such as silicone oil. These additives are suitably used in proper amounts as needed.

10. Resin Composition for Encapsulation

The resin composition for encapsulation according to the present invention can be prepared by sufficiently mixing individual raw materials by means of a stirring and mixing device such as a Henschel mixer when the composition is liquid. The mixing temperature is generally within a range of 20 to 60° C. When the resin composition for encapsulation according to the present invention is powder (compound), it can be prepared by uniformly mixing individual components by means of a high-speed mixer or the like and then sufficiently kneading the resultant mixture by means of a twin roll, continuous kneading machine or the like. The kneading temperature is generally about 30 to 120° C.

In the resin compositions for encapsulation according to the present invention, the filling rate of the fillers may be made high. The total proportion of the fillers composed of the carbon precursor, conductive filler and other inorganic filler is preferably 60 to 93% by weight, more preferably 70 to 90% by weight based on the total weight of the resin composition. The filling rate of the fillers is raised within a proper range, whereby, for example, properties such as surface resistivity, heat resistance, mechanical strength, dimensional stability and chemical resistance can be balanced with one another at a high level.

The surface resistivity of a encapsulated molded product (solidified product or cured product; resin-encapsulated part) obtained by encapsulation-molding the resin composition for encapsulation according to the present invention is $10^5$ to $10^{13} \Omega/\square$, more preferably $10^6$ to $10^2 \Omega/\square$. In general, the surface resistivity of a sample indicates a resistance per unit surface area. The unit thereof is $\Omega$. However, the surface resistivity is represented by $\Omega/\square$ or $\Omega$/sq. (ohm per square) for distinguishing it from a mere resistance. The surface resistivity is a value measured in accordance with the method described in EXAMPLES. The solidified product or cured product of the resin composition for encapsulation according to the present invention is little in variation of the surface resistivity with the locality.

The resin compositions for encapsulation according to the present invention can be used in resin encapsulation for electronic parts, electric parts and the like. The resin compositions for encapsulation according to the present invention are particularly preferably used in resin encapsulation for semiconductor elements. In order to resin-encapsulate a semiconductor element and its peripheral electrode wirings and the like with the resin composition for encapsulation according to the present invention, the composition can be cured and molded by a publicly known molding method such as a transfer molding method, dipping method, potting method, powder fluidization dipping method, underfill method for clip chip mounting, compression molding method or injection molding method. When the semiconductor element and its peripheral electrode wirings and the like are resin-encapsulated with the resin composition for encapsulation according to the present invention, a resin-encapsulated semiconductor unit can be provided.

When the resin composition for encapsulation according to the present invention is high in the filling rate of the fillers and solid at ordinary temperature, a resin-encapsulated semiconductor unit is preferably fabricated by the transfer molding method or injection molding method. In order to conduct resin encapsulation with the resin composition for encapsulant by the transfer molding method, for example, the epoxy resin composition for encapsulation is formed into epoxy tablets (B-stage solid bodies), the epoxy tablets are inserted into a mold heated to a high temperature, and the mold is pressurized to encapsulate a semiconductor chip or module installed in the mold in advance. As curing conditions, the resin composition is cured for 30 to 180 seconds at 150 to 185° C., preferably 160 to 180° C. and then post-cured (after-cured) for 2 to 16 hours at 150 to 185° C., preferably 160 to 180° C.

When the resin composition for encapsulation according to the present invention is liquid, for example, a process comprising electrically connecting electrodes of a semiconductor element to wirings of a wire-donating member by bonding wires or gold bumps, then coating at least the semiconductor element and wiring portions of the wire-donating member with the resin composition for encapsulation by coating, printing or pouring into spaces, and solidifying or curing the resin composition may be adopted. Upon the electrical connection of the semiconductor element to the wire-donating member by the metal bumps, there is also a method of using the resin composition for encapsulation according to the present invention as a reflow-simultaneously curing encapsulant or non-flow encapsulant. Upon the electrical connection of the semiconductor element to the wire-donating member (circuit board) by the metal bumps, there is further a method of coating any one thereof with the resin composition for encapsulation and bringing the semiconductor element into contact under pressure with the wire-donating member.

When the resin composition for encapsulation according to the present invention is used, adhesion property to metallic surfaces forming wirings of the semiconductor element and electrodes and circuits in the wire-donating member can be made high, and moreover moisture resistance can be improved. The semiconductor unit fabricated by using the resin composition for encapsulation according to the present invention is high in reliability such as moisture resistance and heat cycle resistance and also excellent in flexing resistance, impact resistance, vibration resistance and the like. Therefore, extremely high reliability can be obtained even when the resin-encapsulated semiconductor unit is used in an electronic equipment, a portable information equipment or the like in the form of a card.

EXAMPLES

The present invention will hereinafter be described more specifically by the following Examples and Comparative Examples. However, the present invention is not limited to these examples only. Measuring methods of physical properties are given as under.

(1) Measurement of Surface Resistivity:

The surface resistivity of a sample was measured under applied voltage of 100 V using a Hiresta UP (UR-SS probe) manufactured by Mitsubishi Chemical Corporation.

In the measurement of the surface resistivity, a plate-like molded product (30 mm×30 mm×1 mm in thickness) obtained by injection-molding a resin composition by a transfer molding machine was used as a sample. The measurement of the surface resistivity was performed at 5 points of the plate-like molded product. The surface resistivity was indicated as an average value thereof.

(2) Measurement of Static Decay Time

A sample for measurement was placed on a charged plate monitor and charged up to 1,000 V, and electric charge was then discharged through the sample to measure the time (seconds) required until the potential of the sample was reduced to 50 V. The fact that this static decay time is shorter indicates that the tendency to store static electricity is weaker.

Preparation Example 1

Preparation Example of Carbon Precursor ($B_1$)

A pressure container having an internal volume of 300 liters and equipped with a stirring blade was charged with 68 kg of petroleum pitch having a softening point of 210° C., a quinoline-insoluble matter content of 1% by weight and an H/C atomic ratio of 0.63 and 32 kg of naphthalene, and the contents were heated to 190° C. to melt and mix them. The resultant melt was then cooled to 80 to 90° C. and extruded to obtain a string-like formed product having a diameter of about 500 μm. This string-like formed product was then ground so as to give a ratio of diameter to length of about 1.5, and the resultant ground product was poured into a 0.53% aqueous solution of polyvinyl alcohol (saponification degree: 88%) heated to 93° C. and dispersed therein under stirring. The resultant dispersion was cooled to obtain a spherically formed pitch product.

Water was then removed from the spherically formed pitch product by filtration, and naphthalene in the spherically formed pitch product was extracted out with n-hexane in an amount about 6 times as much as the formed pitch product. The spherically formed pitch product obtained in such a manner was held at 260° C. for 1 hour while introducing hot air, thereby conducting an oxidizing treatment to obtain oxidized pitch. This oxidized pitch was heat-treated at 580° C. for 1 hour under a nitrogen atmosphere and then ground to prepare carbon precursor particles having an average particle diameter of about 10 μm. The carbon content in the carbon precursor particles thus obtained was 91.0% by weight.

In order to determine the volume resistivity of this carbon precursor, the oxidized pitch was ground, and the ground product was sifted by means of a mesh having an opening of about 50 μm to remove particles having a particle diameter of 50 μm or greater. Thirteen grams of the thus-obtained ground oxidized pitch powder was charged into a cylindrical mold having a sectional area of 80 cm$^2$ to mold it under a pressure of 196 MPa, thereby obtaining a molded product. This molded product was heat-treated under a nitrogen atmosphere for 1 hour at 580° C. that is the same temperature as the heat-treating temperature in the preparation process of the carbon precursor particles, thereby obtaining a sample (molded product) for volume resistivity measurement of the carbon precursor. The volume resistivity of this sample was measured in accordance with JIS K 7194. As a result, the volume resistivity of the carbon precursor was $3 \times 10^7$ Ω·cm.

Preparation Example 2

Preparation of Carbon Precursor ($B_2$)

A pressure container having an internal volume of 300 liters and equipped with a stirring blade was charged with 68 kg of petroleum pitch having a softening point of 210° C., a quinoline-insoluble matter content of 1% by weight and an H/C atomic ratio of 0.63 and 32 kg of naphthalene, and the contents were heated to 190° C. to melt and mix them. The resultant melt was then cooled to 80 to 90° C. and extruded to obtain a string-like formed product having a diameter of about 500 μm. This string-like formed product was then ground so as to give a ratio of diameter to length of about 1.5, and the resultant ground product was poured into a 0.53% aqueous solution of polyvinyl alcohol (saponification degree: 88%) heated to 93° C. and dispersed therein under stirring. The resultant dispersion was cooled to obtain a spherically formed pitch product.

Water was then removed from the spherically formed pitch product by filtration, and naphthalene in the spherically formed pitch product was extracted out with n-hexane in an amount about 6 times as much as the formed pitch product. The spherically formed pitch product obtained in such a manner was held at 260° C. for 1 hour while introducing hot air, thereby conducting an oxidizing treatment to obtain oxidized pitch. This oxidized pitch was heat-treated at 550° C. for 1 hour under a nitrogen atmosphere and then ground to prepare carbon precursor particles having an average particle diameter of about 10 μm. The carbon content in the carbon precursor particles thus obtained was 91.0% by weight.

In order to determine the volume resistivity of this carbon precursor, the oxidized pitch was ground, and the ground product was sifted by means of a mesh having an opening of about 50 μm to remove particles having a particle diameter of 50 μm or greater. Thirteen grams of the thus-obtained ground oxidized pitch powder was charged into a cylindrical mold having a sectional area of 80 cm$^2$ to mold it under a pressure of 196 MPa, thereby obtaining a molded product. This molded product was heat-treated under a nitrogen atmosphere for 1 hour at 580° C. that is the same temperature as the heat-treating temperature in the preparation process of the carbon precursor particles, thereby obtaining a sample (molded product) for volume resistivity measurement of the carbon precursor. The volume resistivity of this sample was measured in accordance with JIS K 7194. As a result, the volume resistivity of the carbon precursor was $8 \times 10^8$ Ω·cm.

Example 1

To a twin-screw extruder, were fed 100 parts by weight of an epoxy resin component containing 47 parts by weight of an epoxy resin ($A_1$) [biphenyl type epoxy resin; product of Yuka Shell Co., trade name "Epikote YX4000HK"], 5 parts by weight of an epoxy resin ($A_2$) [brominated cresol novolak type epoxy resin; product of Nippon Kayaku Co., Ltd., trade name "BREN-105"] and 48 parts by weight of a curing agent [phenol novolak resin; product of Meiwa Plastic Industries, Ltd., trade name "DL-92"], 0.8 part by weight of a silane coupling agent (product of Dow Corning Toray Co., Ltd., trade name "SZ-6083"), 5 parts by weight of antimony trioxide, 2 parts by weight of carnauba wax (parting agent), 1 part by weight of triphenylphosphine (curing accelerator), 70 parts by weight of the carbon precursor (B1) obtained in Preparation Example 1, and 700 parts by weight of spherical amorphous silica (product of Mitsubishi Rayon Co., Ltd., trade name "QS-4"), and the resultant resin composition was continuously extruded at a cylinder temperature of 170° C. to obtain pellets.

The thus-obtained pellets of the epoxy resin composition were injected into a mold having dimensions of 30 mm in length, 30 mm in width and 1 mm in thickness by means of a transfer molding machine to heat-cure the resin composition for 150 seconds at 175° C. The thus-obtained plate-like molded product was then taken out of the mold and post-cured for 5 hours at 180° C. A sample for measurement was prepared in such a manner. The results are shown in Table 1.

Examples 2 to 5

Samples for measurement were prepared in the same manner as in Example 1 except that the respective components and the proportions of the components incorporated were changed as shown in Table 1. The results are shown in Table 1.

Comparative Examples 1 to 4

Samples for measurement were prepared in the same manner as in Example 1 except that the respective components and the proportions of the components incorporated were changed as shown in Table 1. The results are shown in Table 1.

TABLE 1

|  |  | Example | | | | | Comparative Example | | | |
| --- | --- | --- | --- | --- | --- | --- | --- | --- | --- | --- |
|  |  | 1 | 2 | 3 | 4 | 5 | 1 | 2 | 3 | 4 |
| Epoxy resin component | Epoxy resin $A_1$ | 47 | 47 | 47 | 47 | 47 | 47 | 47 | 47 | 47 |
|  | Epoxy resin $A_2$ | 5 | 5 | 5 | 5 | 5 | 5 | 5 | 5 | 5 |
|  | Curing agent | 48 | 48 | 48 | 48 | 48 | 48 | 48 | 48 | 48 |
| Additive | Silane coupling agent | 0.8 | 0.8 | 0.8 | 0.8 | 0.8 | 0.8 | 0.8 | 0.8 | 0.8 |
|  | Antimony trioxide | 5 | 5 | 5 | 5 | 5 | 5 | 5 | 5 | 5 |
|  | carnauba wax | 2 | 2 | 2 | 2 | 2 | 2 | 2 | 2 | 2 |
|  | Triphenylphosphine | 1 | 1 | 1 | 1 | 1 | 1 | 1 | 1 | 1 |
| Filler | Carbon Precursor $B_1$ | 70 | 385 | 0 | 5 | 0 | 0 | 0 | 0 | 0 |
|  | Carbon Precursor $B_2$ | 0 | 0 | 70 | 385 | 20 | 0 | 0 | 0 | 0 |
|  | Carbon fiber | 0 | 0 | 0 | 0 | 20 | 0 | 0 | — | — |
|  | Conductive carbon black | 0 | 0 | 0 | 0 | 0 | 0 | 2 | 10 | 70 |
|  | Spherical amorphous silica | 700 | 385 | 700 | 385 | 730 | 770 | 768 | 760 | 700 |
| Total amount |  | 878.8 | 878.8 | 878.8 | 883.8 | 878.8 | 878.8 | 878.8 | 878.8 | 878.8 |
| Filler (%) |  | 87.6 | 87.6 | 87.6 | 87.7 | 87.6 | 87.6 | 87.6 | 87.6 | 87.6 |
| Surface resistivity (Ω/sq.) |  | 6E+11 | 8E+09 | 8E+11 | 5E+10 | 1E+11 | >E13 | >E13 | >E13 | <E5 |
| Static decay time (s) |  | 1 | <0.1 | 2 | 0.4 | 0.8 | >20 | >20 | >20 | <0.1 |

(Note)
(1) Epoxy resin ($A_1$): biphenyl type epoxy resin; product of Yuka Shell Co., trade name "Epikote YX4000HK",
(2) Epoxy resin ($A_2$): brominated cresol novolak type epoxy resin; product of Nippon Kayaku Co., Ltd., trade name "BREN-105",
(3) Curing agent: phenol novolak resin; product of Meiwa Plastic Industries, Ltd., trade name "DL-92"],
(4) Silane coupling agent: product of Dow Corning Toray Co., Ltd., trade name "SZ-6083",
(5) Carbon precursor (B1): volume resistivity = $3 \times 10^7$ Ω · cm, carbon content 91.0% by weight,
(6) Carbon precursor (B2): volume resistivity = $8 \times 10^8$ Ω · cm, carbon content 91.0% by weight,
(7) Spherical amorphous silica: product of Mitsubishi Rayon Co., Ltd., trade name "QS-4",
(8) Carbon fiber: product of Toray Industries Inc., trade name "TORAYCA MLD30", volume resistivity = lower than $10^2$ Ω · cm, average diameter = 7 μm, average fiber length = 30 μm,
(9) Conductive carbon black: product of Mitsubishi Chemical Corporation, trade name "MA-100", volume resistivity = lower than $10^2$ Ω · cm,
(10) Indication of Surface resistivity: For example, "6E+11" means $6 \times 10^{11}$. The same shall apply to the others.

As apparent from Table 1, the incorporation of the carbon precursor into the epoxy resin component (Examples 1 to 5) permits controlling the surface resistivity of an encapsulated molded product (cured product) within $10^5$ to $10^{13}$ Ω/☐ of a semiconductive region capable of coping with the ESD troubles and moreover shortening the static decay time to an extremely short period.

As apparent from comparison between Examples 1 and 2, and comparison between Examples 3 and 4, the surface resistivity of the cured product can be controlled to a desired value within the semiconductive region by changing the proportion of the carbon precursor incorporated. It is understood from the results of Example 5 that the surface resistivity of the cured product can be controlled to a desired value within the semiconductive region by using the carbon precursor and carbon fiber in combination even when the total proportion thereof is made low.

On the other hand, when neither the carbon precursor nor the carbon fiber is incorporated (Comparative Example 1), the cured product is in an insulated state and easy to store static electricity.

When the conductive carbon black is incorporated singly, and the proportion thereof is low (Comparative Examples 2 and 3), the cured products are in an insulated state and easy to store static electricity. When the proportion of the conductive carbon black incorporated is made somewhat high (Comparative Example 4), the surface resistivity of the cured product is quickly lowered and does not fall within the semiconductive region.

INDUSTRIAL APPLICABILITY

According to the present invention, there can be provided resin compositions for encapsulation, which are excellent in properties such as mechanical properties, heat resistance, chemical resistance and dimensional stability, and moreover by which the surface resistivity of an encapsulated molded product can be strictly controlled within a semiconductive region while retaining electrical insulating property. Semiconductor units, such as electronic devices, encapsulated with the resin composition for encapsulation according to the present invention are sufficiently protected from not only external environments such as moisture and light, but also the ESD troubles.

Accordingly, the resin compositions for encapsulation according to the present invention can be used as resin encapsulants for electronic parts and electric parts and particularly, can be suitably applied to resin encapsulation of semiconductor elements. Semiconductor units, such as electronic devices, encapsulated with the resin composition for encapsulation according to the present invention can be utilized in a technical field of semiconductors.

The invention claimed is:

1. A semiconductor device encapsulant which is used in resin encapsulation for semiconductor devices and their peripheral electrode wirings, comprising 100 parts by weight of an epoxy resin component (A) containing an epoxy compound having at least 2 epoxy groups in its molecule and a curing agent, wherein the epoxy compound is a mixture composed of an epoxy compound containing no halogen atom and a brominated epoxy compound, 70 parts by weight to not higher than 400 parts by weight of a carbon precursor (B) having a carbon content of 80 to 97% by mass and a volume resistivity of $10^2$ to $10^{10}$ Ω·cm, 0 parts by weight of a conductive filler (C) having a volume resistivity lower than $10^2$ Ω·cm and 100 to 1,500 parts by weight of another filler (D) which is inorganic, wherein the total proportion of the fillers composed of the carbon precursor (B) and said another filler (D) is 70 to 90% by weight based on the total weight of the semiconductor device encapsulant, wherein the surface resistivity of a molded product encapsulated by the semiconductor device encapsulant is $10^6$ to $10^{12} \Omega$ per a surface area unit, and wherein the static decay time required until the potential of the molded product encapsulated by the semiconductor device encapsulant is reduced from 1,000 V to 50 V is at most 10 seconds.

2. The semiconductor device encapsulant according to claim 1, wherein the epoxy compound containing no halogen atom is at least one epoxy compound selected from the group consisting of bisphenol type epoxy resins, novolak type epoxy resins, triphenol alkane type epoxy resins, biphenyl skeletal type epoxy resins, phenol aralkyl type epoxy resins, heterocyclic type epoxy resins, naphthalene skeletal type epoxy resins, stilbene type epoxy resins, dicyclopentadiene type epoxy resins.

3. The semiconductor device encapsulant according to claim 2, wherein the epoxy compound containing no halogen atom is at least one epoxy compound selected from the group consisting of biphenyl skeletal type epoxy resins, dicyclopentadiene type epoxy resins, cresol novolak type epoxy resins, naphthalene skeletal type epoxy resins, triphenol propane type epoxy resins.

4. The semiconductor device encapsulant according to claim 1, wherein the epoxy compound contains the brominated epoxy compound in a proportion of 3 to 30% by weight based on the total weight of the epoxy compounds.

5. The semiconductor device encapsulant according to claim 1, wherein said another filler (D) is spherical amorphous silica.

6. A semiconductor unit, in which a semiconductor element is resin-encapsulated with a semiconductor device encapsulant, wherein the semiconductor device encapsulant is used in resin encapsulation for semiconductor devices and their peripheral electrode wirings, comprising 100 parts by weight of an epoxy resin component (A) containing an epoxy compound having at least 2 epoxy groups in its molecule and a curing agent, wherein the epoxy compound is a mixture composed of an epoxy compound containing no halogen atom and a brominated epoxy compound, 70 parts by weight to not higher than 400 parts by weight of a carbon precursor (B) having a carbon content of 80 to 97% by mass and a volume resistivity of $10^2$ to $10^{10}$ $\Omega \cdot cm$, 0 parts by weight of a conductive filler (C) having a volume resistivity lower than $10^2$ $\Omega \cdot cm$ and 100 to 1,500 parts by weight of another filler (D) which is inorganic, wherein the total proportion of the fillers composed of the carbon precursor (B) and said another filler (D) is 70 to 90% by weight based on the total weight of the semiconductor device encapsulant, wherein the surface resistivity of a molded product encapsulated by the semiconductor device encapsulant is $10^6$ to $10^{12} \Omega$ per a surface area unit, and wherein the static decay time required until the potential of the molded product encapsulated by the semiconductor device encapsulant is reduced from 1,000 V to 50 V is at most 10 seconds.

* * * * *